(12) United States Patent
Strassburg et al.

(10) Patent No.: US 9,553,155 B2
(45) Date of Patent: Jan. 24, 2017

(54) SEMICONDUCTOR DEVICE AND METHOD

(71) Applicant: Infineon Technologies Austria AG, Villach (AT)

(72) Inventors: Matthias Strassburg, Klagenfurt (DE); Gerhard Prechtl, Rosegg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/613,820

(22) Filed: Feb. 4, 2015

(65) Prior Publication Data

US 2016/0225864 A1  Aug. 4, 2016

(51) Int. Cl.
*H01L 21/338* (2006.01)
*H01L 29/423* (2006.01)
*H01L 29/778* (2006.01)
*H01L 29/20* (2006.01)

(52) U.S. Cl.
CPC ..... *H01L 29/42332* (2013.01); *H01L 29/7786* (2013.01); *H01L 29/2003* (2013.01); *H01L 29/42348* (2013.01)

(58) Field of Classification Search
CPC .............. H01L 29/778; H01L 29/7781; H01L 29/7816; H01L 51/102; H01L 21/02241; H01L 21/048; H01L 21/0214; H01L 21/02332; H01L 21/02164; H01L 21/22152

USPC ........ 438/172, 197, 257, 258, 769; 257/200, 257/201, 315, 316, 326, E21.006, 257/E21.055, E21.126, E21.127, E21.267, 257/E21.278, E21.293, E21.395, E21.399
See application file for complete search history.

(56) References Cited

U.S. PATENT DOCUMENTS

| | | | |
|---|---|---|---|
| 6,849,882 B2 * | 2/2005 | Walukiewicz | H01L 29/7783 257/191 |
| 7,638,818 B2 * | 12/2009 | Wu | H01L 29/207 257/192 |
| 7,723,752 B2 * | 5/2010 | Yoshida | H01L 29/408 257/194 |
| 8,183,595 B2 | 5/2012 | Briere | |
| 8,669,589 B2 * | 3/2014 | Wu | H01L 29/207 257/192 |
| 8,866,262 B2 * | 10/2014 | Wada | H01L 29/7393 257/565 |
| 9,214,516 B2 * | 12/2015 | Mine | H01L 29/1608 |
| 9,236,464 B2 * | 1/2016 | Chiang | H01L 29/7784 |
| 9,281,413 B2 * | 3/2016 | Strassburg | H01L 29/788 |
| 2012/0019284 A1 * | 1/2012 | Mauder | H01L 29/402 326/49 |

* cited by examiner

*Primary Examiner* — David Nhu
(74) *Attorney, Agent, or Firm* — Murphy, Bilak & Homiller, PLLC

(57) ABSTRACT

In an embodiment, a semiconductor device includes a High Electron Mobility Transistor (HEMT) including a floating gate. The floating gate includes two or more electrically separated floating gate segments.

20 Claims, 4 Drawing Sheets

SEMICONDUCTOR DEVICE AND METHOD

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a semiconductor device includes a High Electron Mobility Transistor (HEMT) including a floating gate. The floating gate includes two or more electrically separated floating gate segments.

In an embodiment, a semiconductor device includes an enhancement mode Group III nitride-based High Electron Mobility Transistor (HEMT), a floating gate including two or more floating gate segments laterally spaced apart from one another by a dielectric layer and a control gate.

In an embodiment, a method includes separating a floating gate of an enhancement mode Group III nitride-based High Electron Mobility Transistor (HEMT) into two or more floating gate segments laterally spaced apart from one another, forming a dielectric layer between the two or more floating gate segments and forming a sacrificial floating gate segment adjacent a drain of the enhancement mode Group III nitride-based HEMT.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
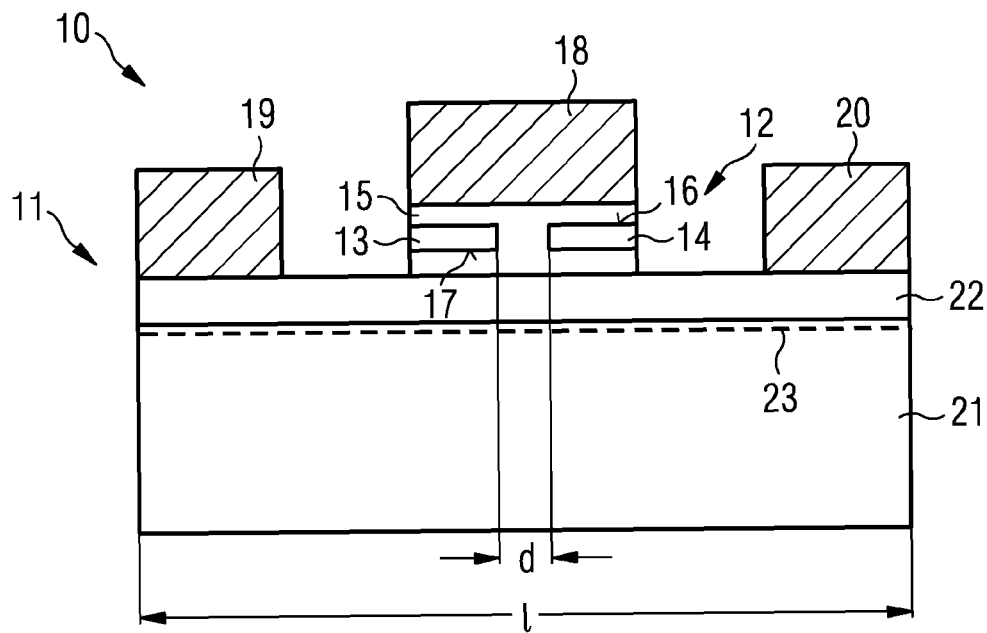
FIG. 1 illustrates a cross-sectional view of a semiconductor device according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride refers to an alloy described by the formula $Al_xGa_{(1-x)}N$, where x<1.

FIG. 1 illustrates a cross-sectional view of a semiconductor device 10 according to a first embodiment.

The semiconductor device 10 includes a High Electron Mobility Transistor (HEMT) 11 including a floating gate 12. The floating gate 12 includes two or more floating gate segments 13, 14 which are electrically separated.

The two or more floating gate segments 13, 14 may be laterally spaced apart from one another and may be substantially coplanar. The lateral spacing may be used to electrically separate floating gate segments 13, 14 from one another. A dielectric layer 15 may be used to electrically separate the floating gate segments 13, 14 from one another. The dielectric layer 15 may extend between the two or more floating gate segments 13, 14 and may extend on the upper surface 16 and lower surface 17 of each of the two or more floating gate segments 13, 14. In some embodiments, the two or more floating gate segments 13, 14 are embedded in and entirely surrounded by the dielectric layer 15.

A control gate 18 may be arranged on the dielectric layer 15 and on the floating gate 12. The control gate 18 may have a lateral extent which is substantially the same as the lateral extent of the floating gate 12. For example, the control gate 18 may have a lateral extent which is substantially the same as the lateral extent between outermost surfaces of the two or more floating gate segments 13, 14 which are laterally spaced apart from one another.

The High Electron Mobility Transistor may also include a source 19 and a drain 20 which are arranged on opposing sides and laterally spaced apart from the control gate 18 and the floating gate 12. The floating gate segment 13 is arranged adjacent the source 19 and the floating gate segment 14 is arranged adjacent the drain 20.

The High Electron Mobility Transistor 11 may be a Group III nitride-based HEMT which includes a channel layer 21 including gallium nitride (GaN) and a barrier layer 22 including aluminium gallium nitride ($Al_xGa_{(1-x)}$) which is arranged on the channel layer 21. A two dimensional electron gas (2DEG) is formed at the interface between the channel layer 21 and the barrier layer 22 which is schematically indicated in FIG. 1 by the dashed line 23.

The two or more floating gate segments 13, 14 may be electrically conductive. For example, the two or more floating gate segments 13, 14 may include a metal. In some embodiments, the two or more floating gate segments 13, 14 include trapped charges. In these embodiments, the two or more floating gate segments 13, 14 may include an oxide which can accommodate charges in interstitial sites or in defect sites such as unoccupied crystal lattice positions.

The two or more floating gate segments 13, 14 may include a metal, a metal alloy, metal compound, an oxide, nitride or an oxynitride. Some embodiments, the two or more floating gate segments 13, 14 include silicon oxide, $SiO_x$, silicon nitride, $SiN_y$, or silicon oxynitride, $SiO_xN_y$.

If a high potential is supplied to the drain electrode, in the pinched-off region between the channel region and the drain electrode, electrons can be accelerated by a drain-to-source voltage with a constant saturation voltage applied across the channel region. A high intensity electrical field can be induced in the pinched-off region near the drain electrode. The high intensity electrical field can accelerate electrons from the floating gate region, which are then attracted to the drain region by the effect of high positive potential level at which the drain is maintained. Consequently, the electrons can be ejected from the floating device, resulting in a shift of the threshold voltage of the device or other device parameters, such as the cutoff voltage, caused by stress and wear out of the device during operation.

Splitting the floating gate into two or more electrically separate segments may be used to produce a more constant cut-off voltage. For example, if a voltage is applied to the drain, an electric field is built up in the transistor channel and in the gate dielectric. At the edges and corners, this causes an increase in field which can be so large that charge carriers can be lost from the floating gate. The greatest field strengths occur at the edges and corners of the drain side segment of the floating gate. Since the drain side floating gate segment is laterally separated from the source side floating gate segment, or in the case of more than two segments, the segment on the source side of the drain side floating gate segment, the source side floating gate segment remains unaffected by the high field strengths. Consequently, the cut-off voltage between the gate and the source remains the same as that which the device originally had.

Charge transfer between the two floating gate segments can occur only when the loss of the charge carriers on the drain side floating gate segment is so large that an electric field is induced between the two floating gate segments. This charge transfer may result in a change in the cut-off voltage. If the spacing of floating gates gate segments is sufficiently large, this charge transfer can be avoided.

The High Electron Mobility Transistor 11 includes an active area which may have a length l. The two floating gate segments 13, 14 may be spaced apart by a distance d, where d is greater or equal to $\frac{1}{1000}$ or $\frac{1}{100}$ or $\frac{1}{10}$. The length l of the active area may be the distance between the source 19 and the drain 20 of the High Electron Mobility Transistor 11.

As used herein, an "active area" is an area of the High Electron Mobility Transistor in which a two-dimensional electron gas (2DEG) is supported when the gate is switched on. A non-active region is a region in which no 2DEG is supported when the gate is switched on.

The distance, d, between adjacent floating gate segments 13, 14 may increase in a lateral direction from the drain to the source. In these embodiments three or more floating gate segments may be provided which may be substantially coplanar and laterally separated from one another. For example, in embodiments in which three floating gate segments are provided, the distance between the drain side floating gate segment and the center floating gate segment may be less than the distance between the source side floating gate segment and the center segment floating gate segment.

The lateral extent of the two or more floating gate segments 13, 14 may be substantially the same or may differ. In some embodiments, the lateral width of adjacent floating gate segments increases in a lateral direction from the drain to the source. For example, in embodiments in which two floating gate segments are provided, the floating gate segment adjacent the source may be laterally wider than the floating gate segment adjacent the drain.

The High Electron Mobility Transistor may be a Group III nitride-based High Electron Mobility Transistor such as a gallium nitride-based High Electron Mobility Transistor.

The High Electron Mobility Transistor may be an enhancement mode transistor device and may be termed a normally-on transistor device. The insertion of a floating gate 12 between the control gate 18 and the semiconductor body of the High Electron Mobility Transistor 11 may be used to transform a depletion mode device, which is normally on, into an enhancement mode device, which is normally off.

In an embodiment, the semiconductor device includes an enhancement mode Group III nitride-based High Electron Mobility Transistor, the floating gate including two or more floating gate segments laterally spaced apart from one another by a dielectric layer and a control gate. The dielectric layer may electrically separate the two or more floating gate segments from one another. In some embodiments, the dielectric layer may also electrically separate the two or more floating gate segments from the control gate.

The enhancement mode Group III nitride-based High Electron Mobility Transistor may include a channel layer arranged on a substrate and a barrier layer arranged on the channel layer. The channel layer may include gallium nitride and the barrier layer may include aluminium gallium nitride. The substrate may include silicon, silicon carbide or sapphire. One or more buffer or transition layers may be provided between the substrate and the channel layer.

The semiconductor device may further include a source and a drain which may be laterally spaced apart from one another to form a lateral transistor device. The floating gate is arranged between the source and the drain and the floating gate segment arranged nearest to the drain provides a sacrificial floating gate segment. The control gate may cover the floating gate segments. In some embodiments, the enhancement mode Group III nitride-based HEMT is a lateral device so that the floating gate and the control gate are arranged laterally between the source and the drain.

In an embodiment, the method includes separating a floating gate of an enhancement mode Group III nitride-based High Electron Mobility Transistor, into two or more floating gate segments laterally spaced apart from one another. A dielectric layer may be formed between the two or more floating gate segments and a sacrificial floating gate segment formed adjacent a drain of the enhancement mode Group III nitride-based High Electron Mobility Transistor.

A control electrode may be formed on the floating gate segments. A dielectric layer may be formed between the two or more floating gate segments and/or between the two or more floating gate segments and the control gate and/or between the two or more floating gate segments and a semiconductor body of the enhancement mode Group III nitride-based High Electron Mobility Transistor.

A source and the drain of the enhancement mode Group III nitride-based High Electron Mobility Transistor may be formed such that the floating gate and the control gate are laterally arranged between the source and the drain.

The floating gate may be separated into two or more floating gate segments by removing the portion of a single floating gate. In some embodiments, the floating gate may be separated into two or more floating gate segments by forming two or more separate floating gate segments on a dielectric layer and providing a further dielectric layer between the two or more floating gate segments. The further dielectric layer may also cover the upper surface of the two or more floating gate segments. The control gate may be arranged on the further dielectric layer above the two or more floating gate segments. The further dielectric layer may be used to electrically insulate the two or more floating gate segments from the control gate.

In another embodiment the two or more separated floating gates segments are not coplanar. In an embodiment, the sacrificial floating gate segment has a greater distance from the 2DEG than the source side floating gate segment. Due to the thicker dielectric layer between the sacrificial floating gate segment and the semiconductor material of the semiconductor device, the field at drain side can be reduced and thus the lifetime of the sacrificial floating may be enlarged without affecting the performance of the device.

Figure 2:
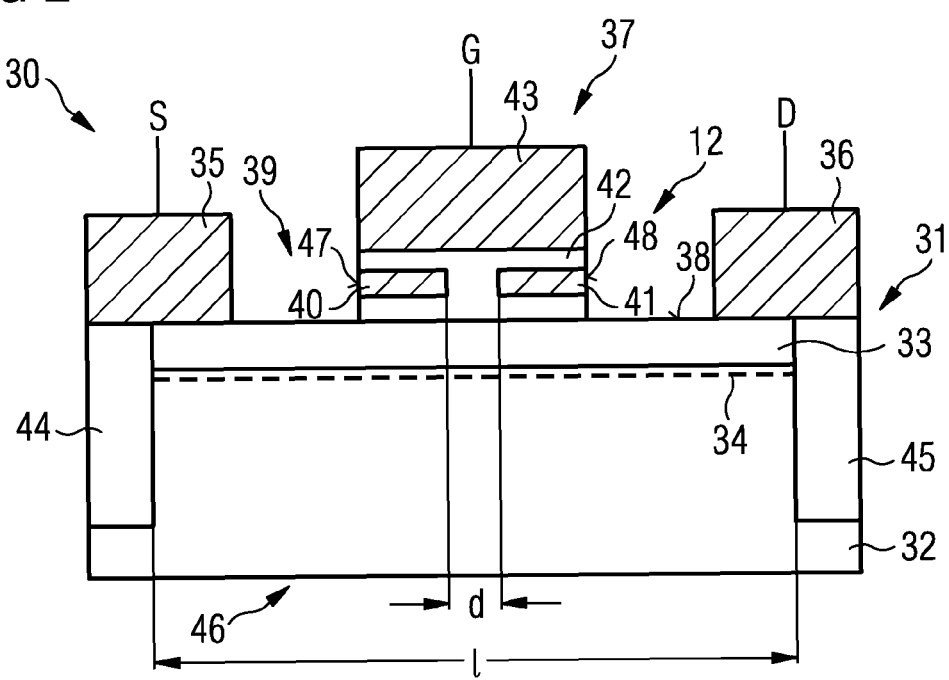
FIG. 2 illustrates a cross-sectional view of a semiconductor device according to a second embodiment.

FIG. 2 illustrates a cross-sectional view of a semiconductor device 30 according to a second embodiment. The semiconductor device 30 includes a High Electron Mobility Transistor, in particular, and an enhancement mode Group III nitride-based High Electron Mobility Transistor 31 which includes a channel layer 32 including gallium nitride and a barrier layer 33 arranged on the channel layer 32. The barrier layer includes aluminium gallium nitride. A two-dimensional electron gas (2DEG), indicated with the dashed line 34 in FIG. 2, is formed at the interface between the gallium nitride layer 32 and aluminium gallium nitride layer 33 due to induced and spontaneous polarization.

The enhancement mode Group III nitride-based High Electron Mobility Transistor 31 further includes a source 35, a drain 36 which is laterally spaced apart from the source 35, and a gate 37 which is laterally arranged between and spaced apart from the source 35 and the drain 36. The source 35, the drain 36 and the gate 37 are arranged on the upper surface 38 of the aluminium gallium nitride layer 33.

In some embodiments, one or more further layers may be arranged on the aluminium gallium nitride layer 33. For example, a gallium nitride cap layer may be arranged on the aluminium gallium nitride layer 33 in regions between the source 35 and the drain 36. A passivation layer may be arranged on the aluminium gallium nitride layer 33 in regions between the gate 37 and the source 35 and between the gate 37 and the drain 36.

The gate 37 includes a floating gate 39 which includes two floating gate segments 40, 41 which are laterally spaced apart from one another by a dielectric layer 42. The gate 37 also includes a control gate 43 arranged on the dielectric layer 42 and above the floating gate segments 40, 41. The two floating gate segments 40, 41 are spaced apart from the upper surface 38 of the gallium nitride layer 33 by a portion of the dielectric layer 42. A portion of the dielectric layer 42 is also arranged between the upper surface of the floating gate segments 40, 41 and the control gate 43. The control gate 43 is arranged on and laterally covers the lateral extent of the floating gate 39.

The semiconductor device 30 also includes isolation trenches 44, 45 which extend underneath the source 35 and drain 36, respectively, through the aluminium gallium nitride layer 33 and into the gallium nitride layer 32. The isolation trenches 44, 45 are, however, optional. If included, the isolation trenches 44, 45 are arranged at the outer edge of the transistor, outside of the cell field.

In the embodiment illustrated in FIG. 2, each of the floating gate segments 40, 41 includes a metal or an alloy.

The source 35, the drain 36, each of the floating gate segments 40, 41 and the control gate 43 may each have a substantially strip-like form and extend substantially parallel to one another. The length of the strip-like form extends into the plane of the drawing. The floating gate segments 40, 41 may be entirely surrounded by the dielectric layer 42 or may have outermost side faces 47, 48 which remain exposed from the dielectric layer 42. The dielectric layer 42 may include an oxide such as SiOx.

The two floating gate segments 40, 41 are spaced apart from one another by a distance d. The enhancement mode Group III nitride-based HEMT includes an active area 46 having a length l. The length l is the distance between the source 35 and the drain 36 in which a two dimensional electron gas is formed.

The distance d between the two floating gate segments is at least a thousandth of the length l of the active area. In other words, $d \geq \frac{1}{1000}$. This distance may be selected to assist in ensuring that electrons are not lost from the floating gate segment 40.

The floating gate segment 41 which is arranged adjacent the drain 36 acts as a sacrificial floating gate. Since the electric field is higher between the drain-side floating gate segment 41 and the drain 36 than between the source-side floating gate segment 40 and the source 35, electrons may be lost from the floating gate segment 41 resulting in a redistribution of electrons within the floating gate segment 41. The floating gate segment 40 remains unaffected since it is laterally and electrically separate from the floating gate segment 41. Consequently, a change in the threshold voltage of the device or other device parameters, such as the cutoff voltage, caused by stress and wear out of the device during operation is avoided.

The enhancement mode Group III nitride-based High Electron Mobility Transistor 31 may be arranged on a non-illustrated substrate, such as silicon, silicon carbide, or sapphire. One or more buffer layers or transition layers may be arranged between the substrate and the aluminium gallium nitride layer 32.

Figure 3:
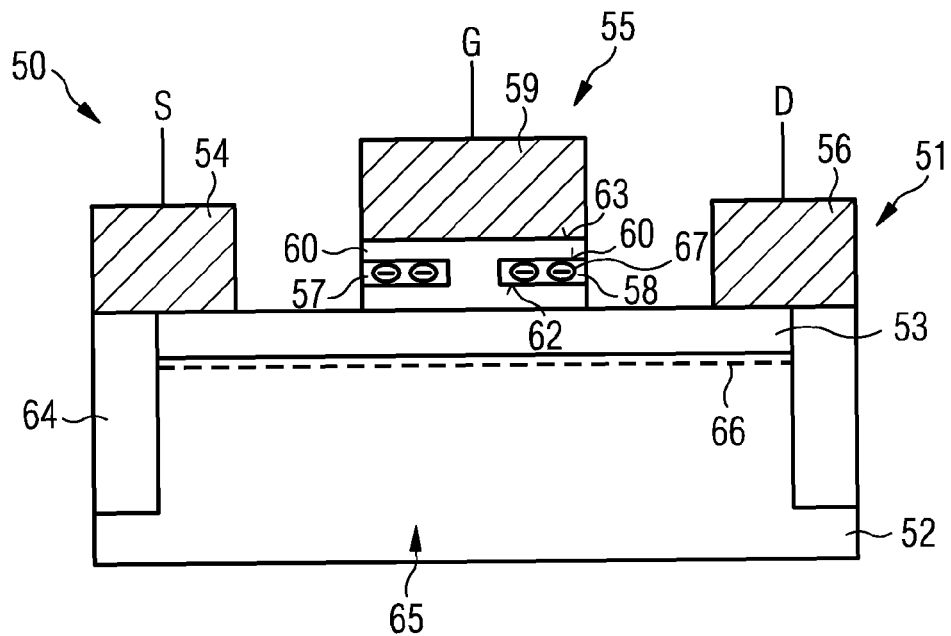
FIG. 3 illustrates a cross-sectional view of a semiconductor device according to a third embodiment.

FIG. 3 illustrates a cross-sectional view of a semiconductor device 50 according to a third embodiment which includes an enhancement mode Group III nitride-based HEMT 51 which includes a gallium nitride channel layer 52 and an aluminium gallium nitride-based layer 53 arranged on the gallium nitride barrier layer 52. A source 54, a gate 55 and a drain 56 are arranged on the aluminium gallium nitride barrier layer 53. The gate 55 includes a floating gate structure including two floating gate segments 57, 58 and a control gate 59. The two floating gate segments 57, 58 are laterally spaced apart from one another by a dielectric layer 60 which also covers the upper surface 61 of the floating gate segments 57, 58 and the lower surface 62 of the two floating gate segments 57, 58. A portion of the dielectric layer 60 may also be arranged between the aluminium gallium nitride layer 53 and the floating gate segments 57, 58. The control gate 59 is arranged on the upper surface 63 of the dielectric layer 60. The dielectric layer 60 may include two or more sublayers, for example a first sublayer may be arranged between the aluminium gallium nitride layer 53 and the floating gate segments 57, 58 and a second sublayer between the floating gate segments 57, 58 and the control gate 59.

The enhancement mode Group III nitride-based HEMT 51 includes trench isolation 64 at its periphery defining the active area 65 in which the two-dimensional electron gas, indicated schematically with a dashed line 66, is formed at the interface between the aluminium gallium nitride channel layer 52 and the gallium nitride-based layer 53.

The semiconductor device 50 according to the third embodiment includes floating gate structure in which the two floating gate segments 57, 58 include trapped charges 67. The two or more floating gate segments 57, 58 may include silicon oxide, silicon nitride or silicon oxynitride, for example.

In this embodiment, the floating gate segment 58 which is arranged adjacent the drain 56 acts as a sacrificial floating gate which loses charge carriers. In particular, the charge carriers closest to the drain 56 are lost first followed by the trapped charges within the floating gate 58 which are positioned at an increasing distance from the drain 56. The trapped charges 67 within the first floating gate segment 57 which is arranged adjacent the source 54 remain trapped within the floating gate segment 57 such that a change in the threshold voltage of the device or other device parameters, such as the cutoff voltage, caused by stress and wear out of the device during operation is avoided.

The enhancement mode Group III nitride-based HEMT 51 may also be arranged on a substrate which is not illustrated in FIG. 3.

Figure 4:
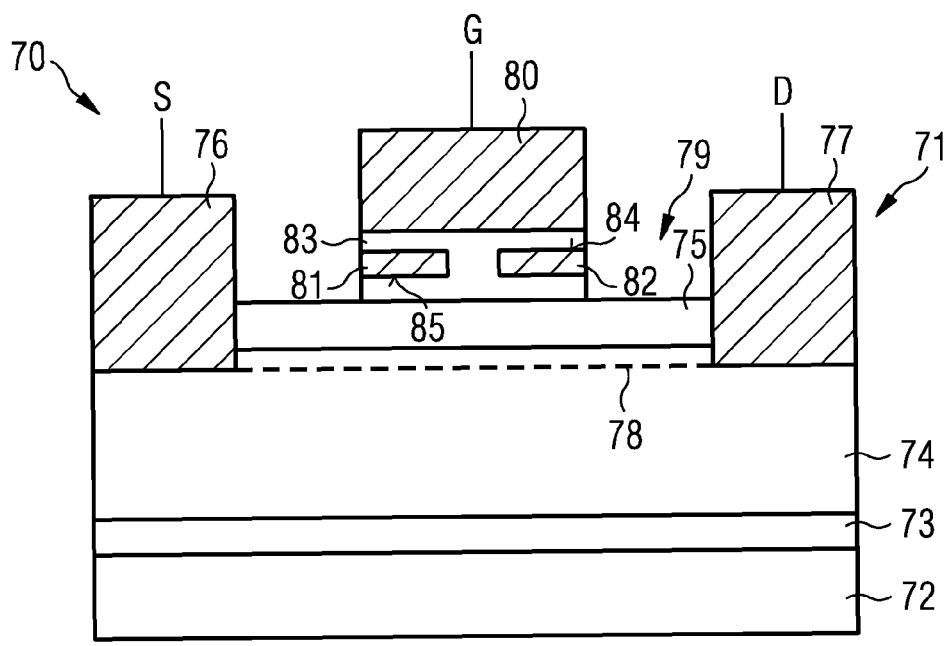
FIG. 4 illustrates a cross-sectional view of a semiconductor device according to a fourth embodiment.

FIG. 4 illustrates a cross-sectional view of a semiconductor device 70 according to a fourth embodiment. The semiconductor device 70 includes an enhancement mode Group III nitride-based HEMT 71 which is arranged on a substrate 72. The substrate 72 may include silicon, silicon carbide, or sapphire, for example. One or more buffer layers and transition layers 73 may be arranged on the substrate 72. A channel layer 74 including gallium nitride is arranged on the buffer or transition layers 73 and a barrier layer including aluminium gallium nitride layer 75 is arranged on the gallium nitride layer channel 74. The enhancement mode Group III nitride-based HEMT 71 includes a source 76 and a drain 77 which are laterally spaced apart. The enhancement mode Group III nitride-based HEMT 71 differs in the arrangement of the source 76 and drain 77. In the enhancement mode Group III nitride-based HEMT 71, the source 76 and the drain 77 extend through the aluminium gallium nitride layer 75 and into the gallium nitride layer 74. The source 76 and the drain 77 are coupled with the two-dimensional electron gas, schematically indicated with dashed line 78, formed at the interface between the gallium nitride layer 74 and the aluminium gallium nitride layer 75.

The enhancement mode Group III nitride-based HEMT 71 further includes a floating gate 79 and a control gate 80 arranged on the floating gate 79 in a stacked arrangement. The floating gate 79 includes two floating gate segments 81, 82 which are laterally spaced apart from one another such that the first floating gate 81 is arranged adjacent source 76 and the second floating gate 82 is arranged adjacent the drain 77. The two floating gate segments 81, 82 are spaced apart from one another and electrically separated from one another by a portion of a dielectric layer 83 which also extends over the upper surfaces 84 and lower surfaces 85 of the floating gate segments 81, 82. A portion of the dielectric layer 83 is arranged between the floating gate segments 81, 82 and the control gate 80 and a portion of the dielectric layer 83 is arranged between the floating gate segments 81, 82 and the aluminium gallium nitride layer 75.

The floating gate segments 81, 82 may include a metal or may include trapped charges.

In the embodiments illustrated in FIGS. 1 to 4, two floating gates segments are provided which may have substantially the same lateral dimensions. However, in some embodiments, the lateral dimensions of the floating gate segments may differ.

Figure 5:
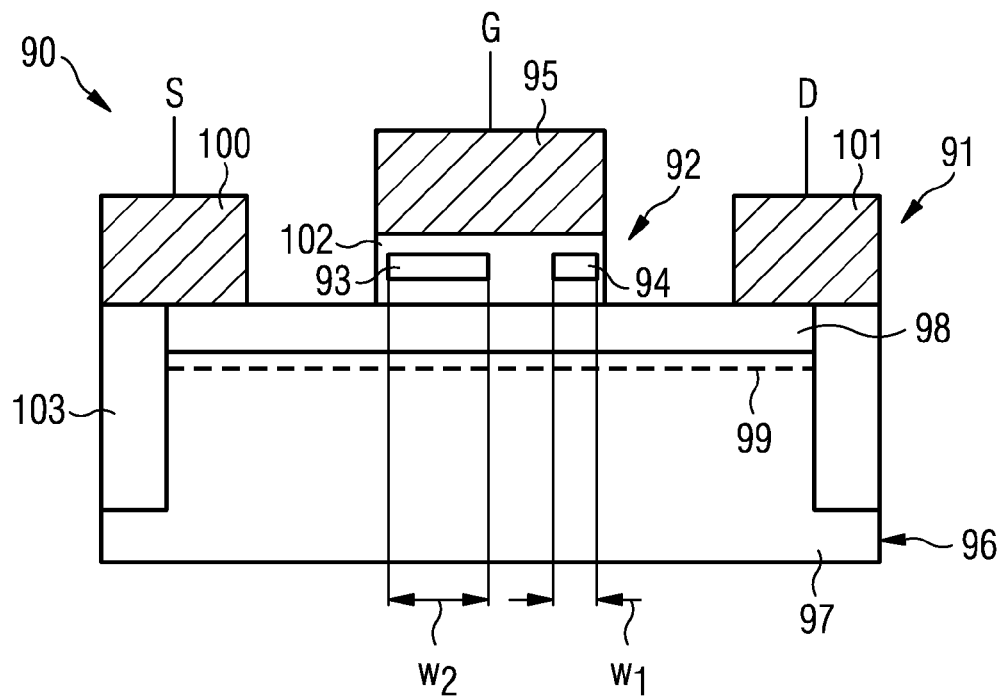
FIG. 5 illustrates a cross-sectional view of a semiconductor device according to a fifth embodiment.

FIG. 5 illustrates a cross-sectional view of a semiconductor device 90 according to a fifth embodiment which includes a High Electron Mobility Transistor 91 including a floating gate 92 including two floating gate segments 93, 94. The floating gate 92 is arranged between a control gate 95 and the semiconductor body 96 of the High Electron Mobility Transistor 91. In the embodiment illustrated in FIG. 5, the High Electron Mobility Transistor 91 is a Group III nitride-based HEMT which is also enhancement mode device due to the provision of the floating gate 92 underneath the control gate 95.

In depletion mode transistor, the floating gate can be used to decrease the absolute value of Vth. This means that, for example, instead of Vth=−12V Vth_new=−3V. This may be useful for the driving concepts and low Vth in combination with high Ns (low Ron resistance) is feasible. Therefore, the correlation that high Ns is only achievable with very low (=very high negative values) Vth can be overruled. The floating gate including two or more electrically separated floating gate segments can be used for enhancement and depletion mode devices.

The semiconductor body includes an gallium nitride layer 97 and an aluminium gallium nitride layer 98 arranged on the gallium nitride layer 97 such that a two-dimensional electron gas 99 is formed at the interface between the gallium nitride layer 97 and the aluminium gallium nitride layer 98. The floating gate 92, a source 100 and a drain 101 are arranged on the gallium nitride layer 98 such that the first floating gate segment 93 is arranged adjacent the source 100 and the second floating gate segment 94 is arranged adjacent the drain 101.

The first floating gate segment 93 is substantially coplanar with the second floating gate segment 94 and is laterally spaced apart and electrically separated from the second floating gate segment 94 by a portion of a dielectric layer 102. The dielectric layer 102 completely surrounds the first floating gate segment 93 and the second floating gate segment 94.

The source 100, drain 101 and floating gate segments 93, 94 have a substantially strip-like form in plan view, the length extending into the plane of the paper in the cross-sectional view illustrated in FIG. 5. In the embodiment illustrated in FIG. 5, the lateral extent of the second floating gate segment 94 is less than that of the first floating gate segment 93. In particular, the width, $w_1$, of the first floating gate segment 94 is less than the width, $w_2$, of the first floating gate segment 93. The width is defined as a direction extending between the source 100 and the drain 101 and substantially perpendicular to the length of the source 100, the drain 101 and the floating gate segments 93, 94.

The dielectric layer 102 may include an oxide, for example $SiO_x$. The third floating gate segments 93, 94 may include a metal or an alloy or a dielectric including trapped charges, for example silicon oxide, silicon nitride, silicon oxynitride with trapped charges or ions. The ions may include negatively charged ions, such as one or more of the group consisting of fluorine, chlorine, bromine and iodine or positively charged ions such as one or more of the group consisting of lithium, sodium, potassium, beryllium, magnesium and calcium. The charges may be electrons or holes.

The High Electron Mobility Transistor 91 may further include peripheral trench isolation 103. The control gate 95 may have a lateral extent which is substantially the same as or slightly larger than the distance between the outermost faces of the first and second floating gate segments 93, 94.

Figure 6:
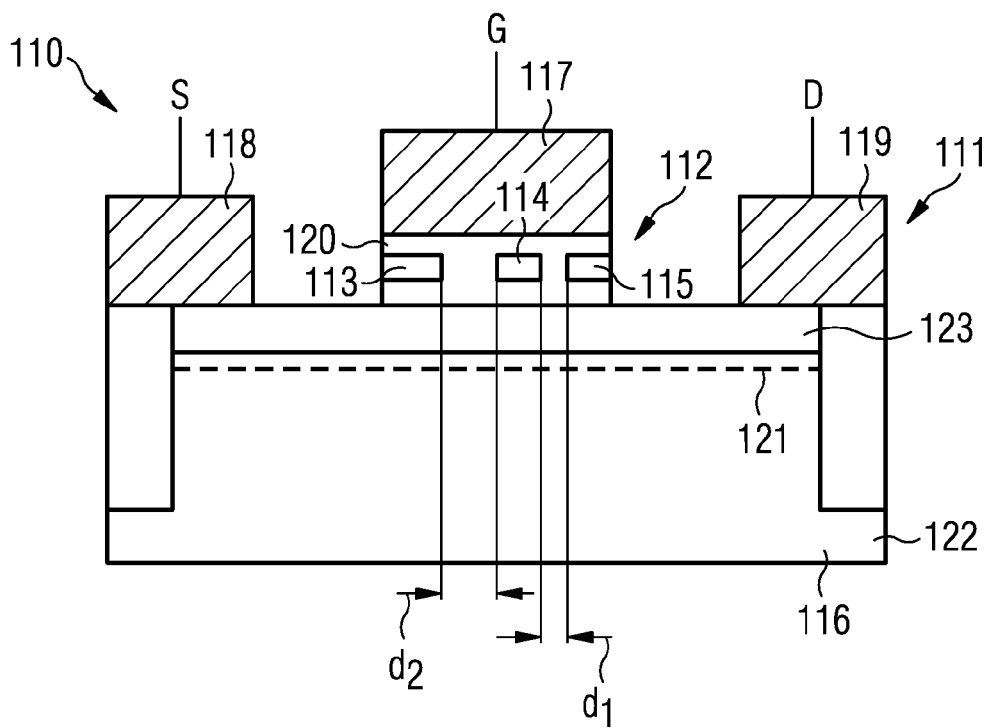
FIG. 6 illustrates a cross-sectional view of a semiconductor device according to a sixth embodiment.

FIG. 6 illustrates a cross-sectional view of a semiconductor device 110 including a High Electron Mobility Transistor 111 including a floating gate structure 112 including three floating gate segments 113, 114, 115. The floating gate 112 is arranged between the semiconductor body 116 of the High Electron Mobility Transistor 111 and a control gate 117. The High Electron Mobility Transistor 111 further includes a source 118 which is arranged adjacent the first floating gate segment 113 and a drain 119 which is arranged adjacent the third floating gate segment 115.

The floating gate segments 113, 114, 115 are substantially coplanar and spaced apart from one another by portions of a dielectric layer 120. The High Electron Mobility Transistor 111 may be Group III nitride-based High Electron Mobility Transistor which includes a gallium nitride channel layer 122 and an aluminium gallium nitride barrier layer 123 arranged on the gallium nitride channel layer 122.

The distance between adjacent floating gate segments differ. For example, the distance between the first floating gate segment 113 and the second floating gate segment 114 is $d_2$ and the distance between the second floating gate segment 114 and the third floating gate segment 115 is $d_1$, whereby $d_2 > d_1$. The floating gate segments 113, 114, 115 may have the same lateral size or width or may have differing lateral sizes or widths. The third floating gate segment 115 which is arranged adjacent the drain 119 may provide a first sacrificial floating gate. The center floating gate segment 114 may provide a second sacrificial floating gate which loses charge to the two-dimensional electron gas, indicated schematically line 121, which is formed between the gallium nitride layer 122 and the aluminium gallium nitride layer 123, after the third floating gate segment 115 has lost its charge to the two-dimensional electron gas. The High Electron Mobility Transistor 111 may be a Group III nitride-based HEMT.

The distance between the third floating gate 115 and the second floating gate 114 is less than the distance between the second floating gate 114 and the first floating gate 113. The second floating gate 114 may serve as a second sacrificial floating gate as the first floating gate 113 may be used to maintain the threshold voltage between the gate and source.

Splitting the floating gate into two or more electrically separate and laterally separate segments may be used to produce a more constant cut-off voltage. Since the drain side floating gate segment is laterally separated from the source side floating gate segment, or in the case of more than two segments, the segment on the source side of the drain side floating gate segment, the source side floating gate segment remains unaffected by the high field strengths. Consequently, the cut-off voltage between the gate and the source remains the same as that which the device originally had.

Figure 7:
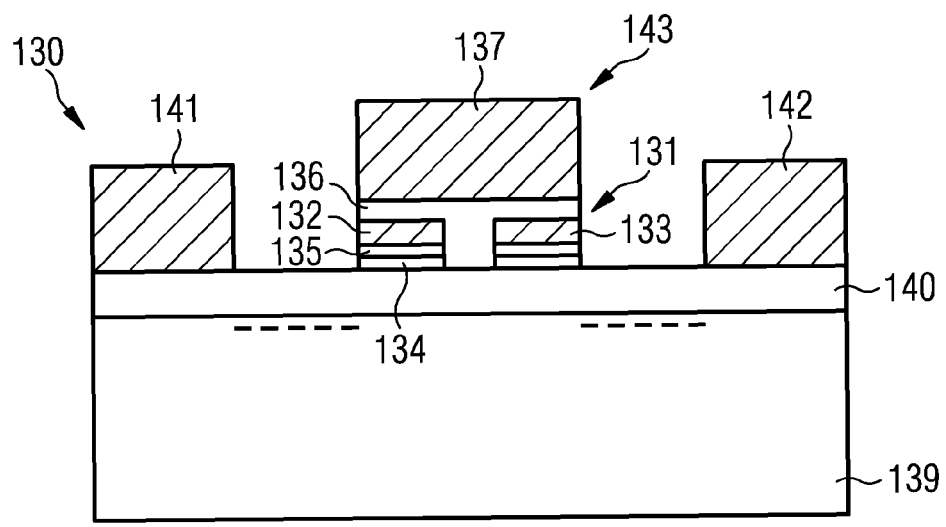
FIG. 7 illustrates a cross-sectional view of a semiconductor device according to a seventh embodiment.

The dielectric layer of the High Electron Mobility Transistor may include two or more sublayers. FIG. 7 illustrates a cross-sectional view of an enhancement mode transistor device 130 according to a seventh embodiment that includes a floating gate 131 with two floating gate segments 132, 133 which are laterally spaced part from one another. The floating gate segments 132, 133 are arranged on a dielectric layer including two sublayers 134, 135. A first lower dielectric sublayer 134 is arranged on an active semiconductor region of the enhancement mode transistor device 130 and a second lower dielectric sublayer 135 is arranged between the first lower dielectric sublayer and the floating gate segments 132, 133. The first lower dielectric sublayer 134 and the second lower dielectric sublayer 135 may include different bandgap energies. For example, the bandgap energy of the first lower dielectric layer 134 may be greater than the bandgap energy of the second lower dielectric sublayer 135.

The enhancement mode transistor device 130 may be a Group III-nitride-based enhancement mode transistor device which includes a Group III-nitride-based channel layer 139, for example gallium nitride, a Group III-nitride-based barrier layer 140, for example aluminium gallium nitride, arranged on the Group III-nitride-based channel layer 139 and forming a heterojunction therebetween, a source 141 and a drain 142 arranged on opposing sides of the gate 143. The gate 143 includes the floating gate 131 and the control gate 137. The source 141, the drain 142 and the gate 143 may be arranged on the Group III-nitride-based barrier layer 140. The floating gate 131 may be arranged between the control gate 137 and the Group III-nitride-based barrier layer 140.

The floating gate 131 may be used to produce an enhancement mode transistor device 130 which is normally off, if the floating gate is sufficiently charged. If the floating gate 131 were to be removed, a depletion mode transistor would be formed that is normally on.

The floating gate 131 is not limited to including two lower sublayers and may include more than two lower dielectric sublayers.

The two or more separated floating gates segments may be substantially coplanar. In some embodiments, the two or more floating gate segments may be laterally spaced apart from one another and arranged in different planes.

Figure 8:
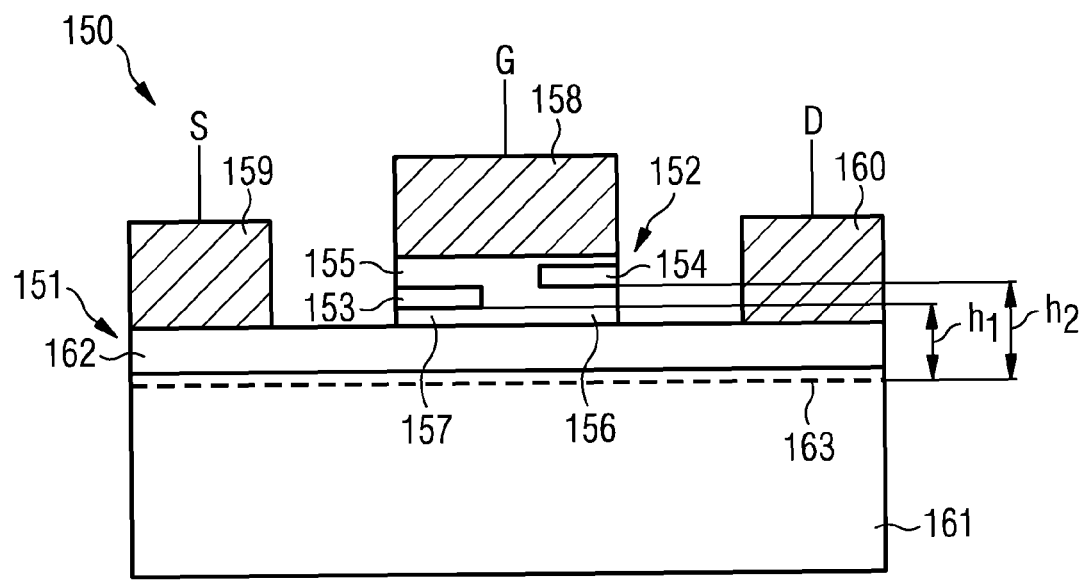
FIG. 8 illustrates a cross-sectional view of a semiconductor device according to an eighth embodiment.

FIG. 8 illustrates a cross-sectional view of a semiconductor device 150 according to an eighth embodiment.

The semiconductor device 150 includes a High Electron Mobility Transistor (HEMT) 151 including a floating gate 152 including at least two floating gate segments 153, 154 which are electrically separated. The two or more floating gate segments 153, 154 are laterally spaced apart and electrically separated from one another by a dielectric layer 155. A control gate 158 is arranged on the dielectric layer 155 and on the floating gate 152. The control gate 158 may have a lateral extent which is substantially the same as the lateral extent of the floating gate 152.

The High Electron Mobility Transistor 151 includes a source 159 and a drain 160 which are arranged on opposing sides and laterally spaced apart from the control gate 158 and the floating gate 152. The floating gate segment 153 is arranged adjacent the source 159 and the floating gate segment 154 is arranged adjacent the drain 160.

The High Electron Mobility Transistor 151 may be a Group III nitride-based HEMT which includes a channel layer 161 including gallium nitride and a barrier layer 162 including aluminium gallium nitride which is arranged on the channel layer 162. A two dimensional electron gas (2DEG) is formed at the interface between the channel layer 161 and the barrier layer 162 which is schematically indicated in FIG. 8 by the dashed line 163.

In the semiconductor device 150 according to the eighth embodiment, the two floating gate segments 153, 154 are arranged in different planes. The floating gate segment 154 adjacent the drain 160 is arranged at a greater distance, $h_2$, from the 2DEG than the distance, $h_1$, of the floating gate segment 153 adjacent the source 159 from the 2DEG.

The dielectric layer 155 in the region 156 between the floating gate segment 154 and the semiconductor material of the semiconductor device 151 has a greater thickness than in the region 157 between the floating gate segment 153 and the semiconductor material of the semiconductor device 151. The dielectric layer 155 may include two or more sublayers which may be arranged so as to position the two floating gate segments 153, 154 in different planes. For example a first sublayer may be extend under both the floating gate segments 153, 154 so that the floating gate segment 154 is spaced from the upper surface of the barrier layer 162. A second sublayer may be arranged on the first sublayer in regions under the floating gate segment 154 and adjacent the floating gate segment 153.

The increased thickness of the dielectric layer 155 underneath the drain side floating gate segment 154 enables the field at drain side of the floating gate 152 to be reduced. This may be used to assist in increasing the lifetime of the sacrificial floating gate segment 154 without affecting the performance of the device.

In an embodiment, the distance between the control gate and the two or more floating gates is the same. This arrangement may be used to ensure that during loading of the floating gate, the charge is equally distributed between the floating gates, since a larger distance means less capacity and thus less charge which affects the threshold voltage of the HEMT.

In an embodiment, the dielectric layer further includes two upper dielectric sublayers which are arranged between the floating gate segments and the control gate. The first upper dielectric sublayer and the second upper dielectric sublayer may have different bandgap energies.

The floating gate segments may be encapsulated by two or more dielectric sublayers. For example, the floating gate segments may be encapsulated by the first lower dielectric sublayer and the second lower dielectric sublayer may encapsulate the first lower dielectric sublayer.

The first lower dielectric sublayer may be selected from the group consisting of $SiO_x$, $SiN_x$ and $SiO_xN_y$. The second lower dielectric sublayer may be selected from the group consisting of $SiO_x$, $SiN_x$ and $SiO_xN_y$. For example, if the first lower dielectric sublayer includes $SiO_x$, the second lower dielectric sublayer may include $SiN_x$ or vice versa. If first and second upper dielectric sublayers are provided, the first upper dielectric sublayer may be selected from the group consisting of $SiO_x$, $SiN_x$ and $SiO_xN_y$ and/or the second upper dielectric sublayer may be selected from the group consisting of $SiO_x$, $SiN_x$ and $SiO_xN_y$. For example, the first upper dielectric sublayer may include $SiO_x$ and the second upper dielectric sublayer may include $SiN_x$ or vice versa.

In embodiments in which the floating gate segments are encapsulated, the floating gate segments may be encapsulated by a first dielectric layer and a second dielectric layer, each including a compound selected from the group consisting of $SiO_x$, $SiN_x$ and $SiO_xN_y$. For example, the first dielectric layer may include $SiO_x$ and the second dielectric layer may include $SiN_x$ or vice versa.

In embodiments including three or more dielectric layers, the composition of the dielectric layers may alternate. For example, a stack including alternating layers of $SiO_x$ and $SiN_x$ may be provided. In some embodiments, the bandgap energies of the layers of the stack may alternate. In some embodiments including three dielectric layers, the centre dielectric layer may include a bandgap energy which is less than the bandgap energy of the contiguous dielectric layers.

The first and second lower dielectric sublayers and first and second upper dielectric sublayers may include a material of the same system, but with differing composition. For example, each of the dielectric layers may include a composition of the system $SiO_xN_y$ with differing oxygen contents.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a High Electron Mobility Transistor (HEMT) comprising a floating gate, the floating gate comprising two or more electrically separated floating gate segments.
2. The semiconductor device according to claim 1, wherein the two or more floating gate segments are laterally spaced apart from one another.

3. The semiconductor device according to claim 1, wherein the two or more floating gate segments are embedded in a dielectric layer.

4. The semiconductor device according to claim 3, further comprising a control gate arranged on the dielectric layer.

5. The semiconductor device according to claim 1, wherein the two or more floating gate segments are laterally spaced apart from one another and arranged in different planes.

6. The semiconductor device according to claim 1, wherein the two or more floating gate segments are electrically conductive.

7. The semiconductor device according to claim 1, wherein the two or more floating gate segments comprise trapped charges.

8. The semiconductor device according to claim 1, wherein the HEMT comprises an active area having a length l and a distance d between two of the floating gate segments, wherein $d \geq 1/10$ or $d \geq 1/100$ or $d \geq 1/1000$.

9. The semiconductor device according to claim 1, wherein a distance d between adjacent ones of the floating gate segments increases in a lateral direction from the drain to the source.

10. The semiconductor device according to claim 1, wherein the lateral width of adjacent ones of the floating gate segments increases in a lateral direction from the drain to the source.

11. The semiconductor device according to claim 1, wherein a lateral extent of the two or more floating gate segments is substantially the same.

12. The semiconductor device according to claim 1, wherein the two or more floating gate segments comprise one of the group consisting of a metal, a metal alloy, a metal compound, an oxide, a nitride and an oxynitride.

13. The semiconductor device according to claim 1, wherein the two or more floating gate segments comprises at least one of the group consisting of silicon oxide, silicon nitride and silicon oxynitride.

14. The semiconductor device according to claim 1, wherein the HEMT comprises a Group III nitride-based HEMT.

15. A semiconductor device, comprising:
an enhancement mode Group III nitride-based High Electron Mobility Transistor (HEMT);
a floating gate comprising two or more floating gate segments laterally spaced apart from one another by a dielectric layer; and
a control gate.

16. The semiconductor device according to claim 15, wherein the enhancement mode Group III nitride-based HEMT comprises a channel layer comprising GaN arranged on a substrate and a barrier layer comprising $Al_xGa(1-x)N$ arranged on the channel layer.

17. The semiconductor device according to claim 15, further comprising a source and a drain, wherein the floating gate is arranged between the source and the drain and the floating gate segment arranged nearest to the drain comprises a sacrificial floating gate segment.

18. The semiconductor device according to claim 17, wherein the enhancement mode Group III nitride-based HEMT is a lateral device.

19. The semiconductor device according to claim 15, wherein the control gate covers the floating gate segments.

20. A method of fabricating a semiconductor device, the method comprising:
separating a floating gate of an enhancement mode Group III nitride-based High Electron Mobility Transistor (HEMT) into two or more floating gate segments laterally spaced apart from one another;
forming a dielectric layer between the two or more floating gate segments; and
forming a sacrificial floating gate segment adjacent a drain of the enhancement mode Group III nitride-based HEMT.

* * * * *